United States Patent [19]

Beyland et al.

[11] Patent Number: 4,468,585
[45] Date of Patent: Aug. 28, 1984

[54] WEDGE BASE LAMP SOCKET

[75] Inventors: Laurens S. Beyland, Falmouth, Me.; Bernard J. Warren, Hillsboro, N.H.

[73] Assignee: GTE Products Corporation, Stamford, Conn.

[21] Appl. No.: 359,470

[22] Filed: Mar. 18, 1982

[51] Int. Cl.³ .............................. H01J 5/48; H01J 5/50
[52] U.S. Cl. .................................... 313/318; 313/315; 339/17 D; 339/125 L; 339/145 R
[58] Field of Search ............. 313/315, 318; 339/17 D, 339/125 L, 127 R, 145 R

[56] References Cited

U.S. PATENT DOCUMENTS

| | | | |
|---|---|---|---|
| 3,206,713 | 9/1965 | Horan | 313/318 |
| 3,555,341 | 1/1971 | Curtis | 313/318 |
| 3,864,006 | 2/1975 | Feldner | 339/145 R |
| 4,005,924 | 2/1977 | Nestor | 339/17 D |
| 4,028,577 | 6/1977 | Gates et al. | 313/318 |
| 4,152,622 | 5/1979 | Fitzgerald | 313/318 |
| 4,181,390 | 1/1980 | Aizawa | 339/65 |

Primary Examiner—Saxfield Chatmon
Attorney, Agent, or Firm—Lawrence R. Fraley

[57] ABSTRACT

A wedge base lamp assembly that includes a lamp socket having a base with opposed side walls and back walls extending integrally therefrom with a lamp-receiving aperture defined between the side walls and an incandescent lamp having a lower press seal and a pair of lead wires extending from the seal and adapted to be inserted into the lamp-receiving aperture in the socket. The front and back walls each have a respective slot for receiving respective ones of the pair of lead wires. Moreover, the front and back walls have a support post on each wall disposed adjacent the wall slot whereby the lead wires are adapted to extend through the wall slot and be wrapped about the support post.

10 Claims, 5 Drawing Figures

WEDGE BASE LAMP SOCKET

DESCRIPTION

1. Technical Field

The present invention relates in general to a wedge base lamp socket or base, and pertains more particularly to a simplified lamp and socket construction in which the lamp is assembled directly in the molded base without the necessity of a separate metallic contact member for providing electrical contact to the lamp.

2. Background

Wedge base lamps disposed in a base or socket are widely used in automotive applications and are typically engaged with a printed circuit board disposed behind the vehicle dashboard. Wedge base lamp assemblies are shown by way of example in U.S. Pat. Nos. 4,152,622 and 4,181,390, British patent application No. 7940429, filed Nov. 22, 1979, and European patent application Publication No. 0031069, filed Aug. 12, 1980. In the prior lamp assemblies, such as in the aforementioned European patent application, the wedge base lamp has lead wires extending therefrom through the press seal at the base of the lamp and extending against the flat surface of the press seal. The lamp with the leads usually extending from opposite sides thereof is adapted for insertion in an assembly comprising a molded base or socket and a metallic contact member. When the lamp is inserted into the contact member with sufficient pressure, electrical connection is provided to connect the lamp lead wires to a separate electrical power source. This connection is usually facilitated with the use of a printed circuit board which provides for electrical connection to the power source.

Thus, in the prior technique, in addition to the lamp, there is required a molded socket or base and a separate metallic contact member. This arrangement has certain disadvantages associated therewith. For example, there is a definite possibility of intermittent electrical contact from the lamp to the power source through the metallic contact member. Also, the presence of the metallic contact member or members provides a more complex assembly, which in turn means that the final product is more costly. Also, a two-part inventory is required by the product user; that is, an inventory is essential for both the socket or base, as well as for the metallic contact member.

DISCLOSURE OF THE INVENTION

Accordingly, it is an object of the present invention to provide an improved wedge base lamp assembly which affords reliable electrical contact with the lamp lead wires.

Another object of the present invention is to provide an improved lamp assembly in which direct electrical connection is provided from the lead wires of the lamp to the circuit board's electrical circuit paths. Thus, in accordance with the present invention, the aforementioned metallic contact member or members are eliminated and direct electrical contact is provided from the lamp to these circuit paths.

A further object of the present invention is to provide a wedge base lamp assembly which comprises fewer parts than prior art assemblies.

Still another object of the present invention is to provide a wedge base lamp assembly which can be constructed less expensively than prior constructions. In this way, the lamp assembly can be replaced as a unit without requiring replacing of the lamp in its associated socket. A burnt out lamp is, therefore, simply disgarded.

Still another object of the present invention is to provide an improved wedge based assembly which is of simplified construction, lighter in weight and which provides for a positive interconnection of the lamp with the associated circuit board.

To accomplish the foregoing and other objects of this invention there is provided a wedge base lamp assembly which comprises a lamp socket constructed of an electrically insulating material and having a base adapted to be received by a circuit board and including opposed side walls extending from the base and having facing inner surfaces defining therebetween a lamp-receiving aperture having an upper aperture section of greater diameter than a lower aperture section. These different diameter aperture sections are configured to receive an incandescent lamp having a lower press seal adapted to fit within the lower aperture section, a bulb portion adapted to in partially positioned within the larger upper aperture section, and a pair of lead wires extending from the press seal and each of a length greater than the overall height of the press seal. Preferably, the lead wires are of a length at least as long as the length of the incandescent lamp. The lamp socket includes, in addition to the side walls, cooperating opposed front and back walls also extending from the socket base and each having a slot therethrough communicating from the lamp-receiving aperture to outside the socket. The front and back wall slots are for receiving respective ones of the pair of lead wires. The front and back walls each have a lead wire-receiving support post extending from the wall and disposed adjacent to the wall slot. The lead wires are individually adapted to extend through the wall slot, either the front or back wall slot, and for being wrapped about the associated support post.

In accordance with further aspects of the present invention, the press seal and lower aperture section preferably have mating interlock means for retaining the lamp in its lamp-receiving aperture. This may include one or more recesses in the press seal and associated tab or tabs extending from the inner surface of the lower aperture section. The support post is preferably flat sided and may have a square cross-section so as to provide a spring type action essentially leaving a slight space between the flat side of the post and the curved lead as it is wrapped about the post. This provides for improved, wiping type of circuit connection from the lamp to the associated circuit board's path.

In accordance with additional aspects of this invention, one of the support posts is adjacent the slot toward one side wall while the other support port is adjacent the slot toward the other, opposing side wall. The front and back walls each preferably have a top rim extending to either side of the wall. In this rim there is provided an inverted V-notch in the rim bottom for providing proper registration of the lamp socket with the associated circuit board component.

In accordance with a still further aspect of this invention, each of the aforementioned slots in each of the front and back walls is preferably disposed vertically and has an open top portion. Also, in addition to these slots, there are provided spaced grooves which are defined between the side walls and respective front and back walls. These are provided to enable the sides of the base to flex outwardly in a spring-like fashion when the lamp is inserted.

BEST MODE FOR CARRYING OUT THE INVENTION

Figures 1, 2:
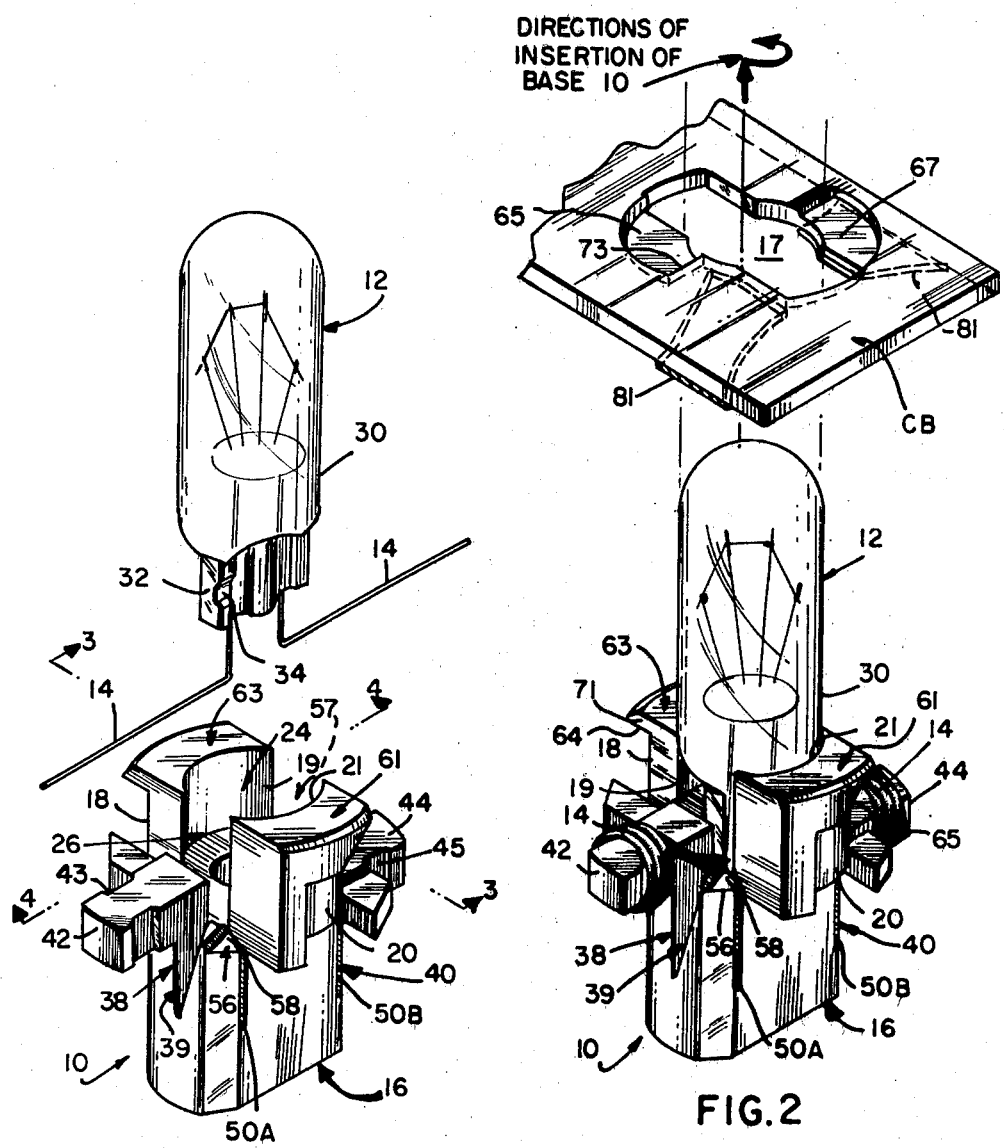
FIG. 1 is an exploded perspective view of a wedge lamp base assembly in accordance with a preferred embodiment of the present invention.
FIG. 2 is a perspective view of the assembly shown in FIG. 1, as assembled, immediately prior to being positioned within the aperture of a circuit board component, both of these also being shown.

For a better understanding of the present invention together with other and further objects, advantages and capabilities thereof, reference is made to the following disclosure and appended claims in connection with the above-described drawings.

Referring to the drawings, there is shown a preferred construction of the wedge base lamp assembly of the present invention which in general comprises a lamp socket 10 which is constructed of an electrically insulating material such as plastic, and an incandescent lamp 12 which may be of conventional design but provided with extra long lead wires 14. The lamp socket 10 comprises a base 16 adapted for being positioned within the aperture 17 of a circuit board CB, and opposed side walls 18 and 20 extending integrally from the base and having facing inner surfaces 19 and 21 respectively, defining therebetween a lamp-receiving aperture 24. The aperture 24 has substantially two different diameter sections including an upper aperture section 26 and a lower aperture section 28. The upper aperture section 26, as noted in the drawings, is of greater diameter than the lower aperture section 28. Thus, the aperture for receiving incandescent lamp 12 is defined substantially entirely by the side walls 18 and 20.

Figure 3:
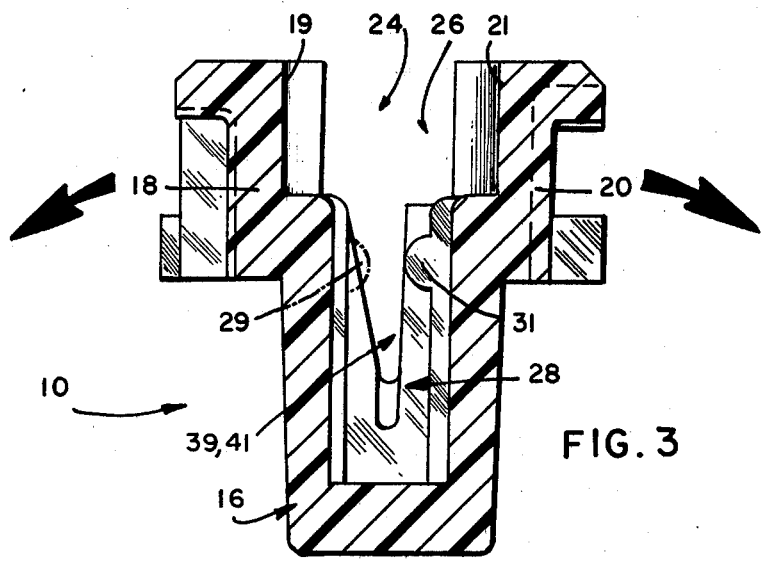
FIG. 3 is a side elevation view of the socket of FIG. 1 partially sectioned away, said view taken along the line 3—3 in FIG. 1.
Figure 4:
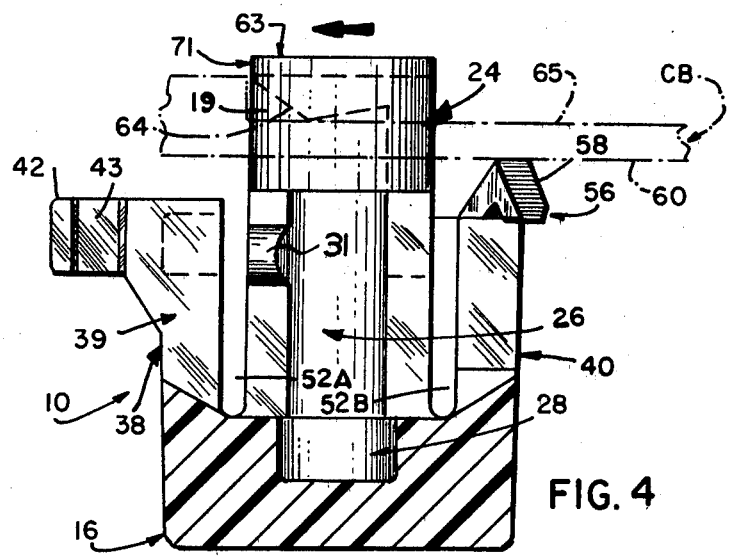
FIG. 4 is a side elevational view of the socket of FIG. 1 taken along the line 4—4 in FIG. 1.

The incandescent lamp 12 includes a bulb (envelope) portion 30 and a lower press seal portion 32. As mentioned previously, lead wires 14 are of substantial length preferably longer than the length of the entire lamp (bulb and press seal). These lead wires extend from the bottom of the press seal 32 as shown in FIG. 1. The press seal 32 preferably also has oppositely disposed D-shaped recesses 34. That is, one recess 34 is provided on each of the opposing, larger two sides of the substantially four-sided seal. Only one recess 34 is shown in FIG. 1, the remaining one understandably being formed within the press seal on the opposite wall and therefore hidden from the viewer. In this regard the socket 10 has similarly disposed tabs (projections) for each mating with a corresponding one of the recesses 34 to thus provide an interlock means to secure the lamp within associated socket 10. These tabs are shown as numerals 29 and 31 in the drawings and are associated, respectively, with facing inner surfaces 19 and 21 defining the lamp-receiving aperture 24 (see especially FIG. 3). It must be stated that one tab (29) is shown in phantom in FIG. 3, said tab being actually positioned closer to the viewer than the corresponding, opposing tab 31. Tab 31 is also shown in FIG. 4.

The lamp socket 10, in addition to including the side walls 18 and 20, also includes opposed front and back walls 38 and 40 also extending integrally from socket base 16. The front wall 38 has an associated, vertically disposed slot 39 and similarly, the back wall 40 has an associated, vertically disposed slot 41. Each of these slots 39, 41 extend from the inner to the outer surface of the front and back wall communicating from the lamp receiving aperture 24 to outside of the socket. These front and back wall slots, 39, 41 are for receiving respective ones of the pair of lead wires 14. With particular attention to the perspective view in FIG. 2, one of the wires 14 extending from lamp 12 is shown being positioned within (and extending through) slot 39. The remaining slot 41 is, understandably, positioned on an opposing side of base 16 and therefore hidden from the viewer.

The front and back walls 38 and 40 have, adjacent each of their respective slots 39 and 41, a wire support post (42, 44). These lead wire-receiving posts extend from their corresponding front and back wall (38, 40) in a position so that the corresponding lead wire 14 may extend through the slot and be wrapped around the support post. To maintain the wire securely on each post, the post is provided with an square shaped channel 43. Thus, the post 42 in FIGS. 1 and 2 has an associated square shaped channel 43 and the post 44, located on the opposite side of base 16 from post 42, has an associated square shaped channel 45. Support post 42 and channel 43 are also illustrated in FIG. 4 and are shown extending outwardly from wall 38.

In accordance with the preferred construction of this invention, the side walls are not connected to the front and back walls. Thus, in the drawings, it is noted that there is provided a first pair of grooves 50A, 50B (FIG. 1) separating one side wall from the front and back walls, and a second pair of grooves 52A, 52B separating the other side wall from the front and back walls. Grooves 50A and 50B are clearly shown in FIGS. 1 and 2, while opposing grooves 52A and 52B are shown in FIG. 4. It is understood that grooves 52A and 52B are located within base 16 opposite to grooves 50A, 50B and are therefore hidden from the viewer in FIGS. 1 and 2. These two pairs of grooves or slots enable sufficient flexing outwardly by base 16, in a spring-like manner (shown by arrows in FIG. 3), to permit ease of insertion of the lamp into the lamp receiving aperture. This is a resilient action so that once the lamp is in place the pairs of grooves tend to close, and, as stated above, tabs 29 and 31 lock within corresponding recesses 34 in seal portion 32.

The lamp socket also provides a means for firmly interlocking the socket to printed circuit board CB. In this regard, side walls 18 and 20 have respective rims 56 and 57 each provided with an inverted V-shaped notch portion. Rim 57 is located on the opposite side of base 16 from rim 56 and is therefore hidden from the viewer in FIGS. 1 and 2. It is represented by the dashed line 57 in FIG. 1. As shown in the drawings (see also FIG. 4), rim portion 56 includes as part thereof notch portion 58. Understandably, rim portion 57 possesses a similar member. The function of these resilient notches is to forcibly engage a corresponding bottom surface 60 (FIG. 4) of circuit board CB to exert pressure thereagainst while socket 10 is fully positioned (inserted)) within opening 17 of the board (in the manner depicted by the directional arrow in FIG. 2). That is socket 10, having lamp 12 seated therein, is inserted through opening 17 only to the extent that the upper engagement (or holding) wing portions 61 and 63 of associated walls 20 and 18, respectively pass completely therethrough. Once fully inserted, the socket is turned (counterclockwise in FIG. 2) with the angled edge of each wing portion slidably engaging a corresponding upper indentation of board CB. In FIG. 2 (see also (FIG. 4), the angled edge (64) of wing portion 63 slidably engages surface (indentation) 65 of board CB while the angled edge (65) of wing portion 61 slidably engages corresponding indentation 67. Rotation is complete (and socket 10 thereby locked in position in board CB) when a forward edge (71 in FIG. 4) of each wing portion engages a corresponding upstanding wall in board CB (i.e., wall 73 in FIG. 2).

Figure 5:
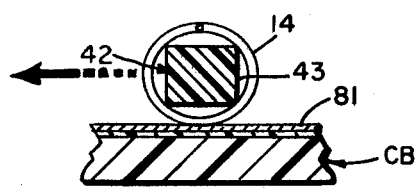
FIG. 5 is an elevational view, in section, showing the spring-like, wiping motion of the invention's lead wire during contact with the circuit path depicted in FIG. 2, FIG. 5 being inverted for purposes of illustration.

The incandescent lamp 12 is secured to its lamp socket in the following manner. The lamp with extra long lead wires 14 is inserted directly into the socket with the lead wires extending out either side of the lamp and guided into the accommodating slots in the respective front and back walls of the socket. The lamp is held in place by means of the recess and projection construction previously discussed. Each of the leads is then wrapped in a circular motion around the associated square post (42 or 44) shown in the drawings. As the wire is wrapped in this circular motion around each square projection, it remains arc-shaped over each flat surface and leaves a small space between the arc of the wire and the post's flat surface so as to permit a certain amount of wire compression. This is shown in FIG. 5. As shown therein, this arc-shaped wire arrangement about the square cross section post (42) causes the wire 14 to exert a spring-like force against the corresponding circuit path 81 during the "wiping" engagement therewith. Though inverted in FIG. 5, it is understood that each wound wire segment slidably engages the corresponding circuit path (e.g., copper) during the aforementioned clockwise turning of socket 10 within board CB. This form of contact thus assures a positive electrical connection with the associated board circuitry during initial, as well as repeated (if necessary), insertions of the socket-lamp assembly. As described, therefore, a total of no less than six surfaces (including four of base 16 and at least two of the wrapped wire segments) positively engage board CB and its circuitry when the invention is located therein. Actually, more surfaces provide contact in that multiple turns of the wire are designed so as to provide more of an opportunity for wire contact with the circuit board's circuitry 81. Thus, there is less of an opportunity for loos of electrical contact due to such conditions as vibration, shocke, etc.

With the construction of the present invention, there is provided only a lamp and socket without any need for a separate intermediate electrical contact member. The lamp connects by its lead wires directly to the power source as represented by the circuit board CB. When the socket is twisted and locked to the circuit board, the lead-in wire wrapped about the post makes direct contact with conductor runs on the circuit board in the manner shown (FIG. 5).

While there have been shown and described what are at present considered the preferred embodiments of the invention, it will be obvious to those skilled in the art that various changes and modifications may be made therein without departing from the scope of the invention as defined by the appended claims. For example, one type of wedge base lamp is depicted but it is understood that other forms of wedge base lamp may also be employed with the socket of this invention. Also, in addition to usage in the automotive field, the concepts of the invention may be applied to other fields such as aircraft instrument lighting.

What is claimed is:

1. A wedge base lamp assembly comprising:
   a socket constructed of an electrically insulating material and having a base adapted for being positioned within an aperture within a circuit board and including opposed side walls extending from the base and having facing inner surfaces defining therebetween a lamp-receiving aperture having an upper aperture section of greater diameter than a lower aperture section; and
   an incandescent lamp having a lower press seal and a pair of lead wires extending from the seal and each of a length greater than the height to be inserted into said lamp-receiving aperture, said socket including opposed front and back walls extending from said socket base and each having a slot therethrough communicating from the lamp-receiving aperture to outside the wall, said front and back wall slots for receiving respective ones of said pair of lead wires, said front and back walls each having a flat-sided lead wire receiving support post extending from the wall and disposed adjacent the wall slot, said lead wires each extending through a respective one of said wall slots and being wrapped about a respective one of said support posts to provide a spring-like electrical connection with a respective circuit path located on said circuit board when said base of said socket is positioned within said aperture of said board.

2. A wedge base lamp assembly as set forth in claim 1 wherein said press seal and lower aperture section of said base have mating interlock means for retaining said lamp within said lamp-receiving aperture of said base.

3. A wedge base lamp assembly as set forth in claim 2 wherein said mating interlock means comprises a recess in the press seal of said lamp and a tab extending from the inner surface of the lower aperture section of said socket.

4. A wedge base lamp assembly as set forth in claim 3 wherein said interlock means includes a pair of opposed recesses and a pair of opposed tabs.

5. A wedge base lamp assembly as set forth in claim 1 wherein said support post is substantially square in cross section.

6. A wedge base lamp assembly as set forth in claim 1 wherein one of said support posts is adjacent the slot toward one side wall while the other of said support posts is adjacent the slot toward the other side wall.

7. A wedge base lamp assembly as set forth in claim 1 wherein said front and back walls each have a top rim extending to either side of the wall.

8. A wedge base lamp assembly as set forth in claim 7 including an inverted V-notch in the rim bottom.

9. A wedge base lamp assembly as set forth in claim 1 wherein each of said wall slots is disposed vertically and is open from the top.

10. A wedge base lamp assembly as set forth in claim 1 including spaced grooves defined between the side walls and respective front and back walls, said grooves enabling said base to flex outwardly in a spring-like manner during insertion of said lamp therein.

* * * * *